(12) United States Patent
Van Duyne et al.

(10) Patent No.: US 10,367,486 B2
(45) Date of Patent: Jul. 30, 2019

(54) HIGH SPEED ON-CHIP PRECISION BUFFER WITH SWITCHED-LOAD REJECTION

(71) Applicant: Linear Technology Holding LLC, Norwood, MA (US)

(72) Inventors: Stephen Todd Van Duyne, Calhan, CO (US); Kalin Valeriev Lazarov, Colorado Springs, CO (US); Zhiming Xiao, Colorado Springs, CO (US)

(73) Assignee: Linear Technology Holding LLC, Norwood, MA (US)

( * ) Notice: Subject to any disclaimer, the term of this patent is extended or adjusted under 35 U.S.C. 154(b) by 0 days.

(21) Appl. No.: 15/795,181

(22) Filed: Oct. 26, 2017

(65) Prior Publication Data

US 2019/0131959 A1 May 2, 2019

(51) Int. Cl.
*H03K 5/08* (2006.01)
*H03K 21/40* (2006.01)
*H03K 5/00* (2006.01)

(52) U.S. Cl.
CPC .............. *H03K 5/08* (2013.01); *H03K 21/40* (2013.01); *H03K 2005/0011* (2013.01)

(58) Field of Classification Search
CPC ... H03K 5/08; H03K 21/40; H03K 2005/0011
USPC ......................................................... 327/77
See application file for complete search history.

(56) References Cited

U.S. PATENT DOCUMENTS

| 5,444,446 | A | 8/1995 | Gopinathan et al. |
| 5,563,819 | A | 10/1996 | Nelson |
| 6,031,398 | A | 2/2000 | Karanicolas |
| 6,094,155 | A * | 7/2000 | Fees ..................... H03M 1/0863 327/401 |
| 6,417,725 | B1 | 7/2002 | Aram et al. |
| 6,498,511 | B2 | 12/2002 | Tamura et al. |
| 6,778,013 | B1 | 8/2004 | Ali |
| 7,265,607 | B1 | 9/2007 | Rajapandian et al. |
| 7,312,741 | B2 | 12/2007 | Nakajima |
| 7,327,166 | B2 * | 2/2008 | Zanchi .................... G05F 3/222 326/84 |
| 7,619,448 | B2 | 11/2009 | Wu et al. |

(Continued)

FOREIGN PATENT DOCUMENTS

WO   WO-2013/033622 A1   3/2013

OTHER PUBLICATIONS

"European Application Serial No. 18202179.0, Extended European Search Report dated Mar. 20, 2019", 12 pgs.

(Continued)

*Primary Examiner* — Dinh T Le
(74) *Attorney, Agent, or Firm* — Schwegman Lundberg & Woessner, P.A.

(57) ABSTRACT

A buffer system may have an output for driving a switched load that changes during periods indicated by a switching signal. The buffer system may operate in a closed loop when the switching signal indicates that a load change is not taking place by comparing a signal indicative of the output of the buffer system with a reference voltage. The buffer system may operate in an open loop when the switching signal indicates that a load change is taking place by not comparing signal indicative of the output of the buffer system with the reference voltage. Both the buffer system and the switched load may be on the same chip.

17 Claims, 5 Drawing Sheets

(56) References Cited

U.S. PATENT DOCUMENTS

| | | | |
|---|---|---|---|
| 7,705,672 | B1 | 4/2010 | Rodriguez |
| 7,907,074 | B2 | 3/2011 | Zanchi et al. |
| 8,513,935 | B2 | 8/2013 | Brokaw |
| 8,841,893 | B2 | 9/2014 | Bulzacchelli et al. |
| 8,901,987 | B1 | 12/2014 | Le et al. |
| 2001/0043097 | A1 | 11/2001 | Akita |
| 2005/0242791 | A1 | 11/2005 | Rajapandian et al. |
| 2007/0040580 | A1 | 2/2007 | Zanchi et al. |
| 2012/0049951 | A1* | 3/2012 | Venkataraman ..... G11C 27/026 330/112 |
| 2012/0105045 | A1 | 5/2012 | Burns et al. |
| 2013/0207627 | A1 | 8/2013 | Kahn et al. |
| 2014/0084878 | A1 | 3/2014 | Tomioka et al. |
| 2014/0250310 | A1 | 9/2014 | Chepuri et al. |
| 2016/0154415 | A1 | 6/2016 | Biziitu et al. |

OTHER PUBLICATIONS

Bettini, Luca, "A Reconfigurable DT $ Delta Sigma $ Modulator for Multi-Standard 2G 3G 4G Wireless Receivers", IEEE Journal on Emerging and Selected Topics in Circuits and Systems, Piscataway, NJ, USA, vol. 5, No. 4, (Dec. 1, 2015), 525-536.

Hongmei, Zhao, "Beam Shaping for Satellite Phased Array Antenna Using Dual Coding Genetic Algorithm", IEEE 5th Intl. Conference on Wireless Communications, Networking and Mobile Computing (Wicom) Piscataway, NJ, USA, (Sep. 24, 2009), 1-4.

* cited by examiner

HIGH SPEED ON-CHIP PRECISION BUFFER WITH SWITCHED-LOAD REJECTION

FIELD OF THE DISCLOSURE

This disclosure s to high speed buffers that drive switched loads.

BACKGROUND

High speed buffers may be used to drive switched loads, i.e., loads that require a finite amount of charge/current for a finite period of time. Loads that exhibit this behavior are generally, but are not limited to being switched-capacitor in nature.

Some high-speed buffers use an "open-loop" for driving large switched-loads. This approach can result in deviations from the desired output voltage as time and temperature change. High-gain feedback is omitted from open loop buffers due to speed limitations that ultimately can affect settling time. With open loop approaches, a speed requirement may be met, but a precision requirement may not be met.

Other high-speed buffers use a "closed-loop" in which a signal indicative of the output is compared to a reference voltage and adjustments are made to the output to match that reference voltage. Here, however, the opposite tradeoff can be the case: a precision requirement may be met, but a speed requirement may not be met.

Other circuit designs use external capacitors to help deliver charge to a switched-load. However, these designs can require additional pins and external components. This can be prohibitive in designs with low pin count requirements.

SUMMARY OF THE DISCLOSURE

A buffer system may have an output for driving a switched load that changes during periods indicated by a switching signal. The buffer system may operate in a closed loop when the switching signal indicates that a load change is not taking place by comparing a signal indicative of the output of the buffer system with a reference voltage. The buffer system may operate in an open loop when the switching signal indicates that a load change is taking place by not comparing signal indicative of the output of the buffer system with the reference voltage. Both the buffer system and the switched load may be on the same chip.

An error amplifier may generate an error signal output indicative of a difference between the reference voltage at a first input to the error amplifier and a monitored voltage at a second input to the error amplifier.

A main buffer may buffer the error signal output from the error amplifier and deliver that buffered error signal output to the output of the buffer system. A replica buffer may buffer the error signal output from the error amplifier.

A capacitance may be connected between the output of the replica buffer and the second input to the error amplifier. A controllable electronic switch may connect the second input of the error amplifier to the output of the buffer system when the switching signal indicates that a load change is not taking place, and disconnect the second input of the error amplifier from the output of the buffer system when the switching signal indicates that a load change is taking place.

The output of the buffer system may be single ended or differential.

The main buffer and the replica buffer may be auto-zeroing buffers.

The main buffer and the replica buffer may include chopper stabilization.

The buffer system may include a backend calibration circuit.

Both the buffer system and the switched load may be on the same chip.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

High-speed on-chip precision buffers with switched-load rejection will now be described. The switched-load rejection may allow for low-bandwidth, high-gain feedback, producing increased precision, without sacrificing buffer speed in switched-load circuit systems.

Figure 1:
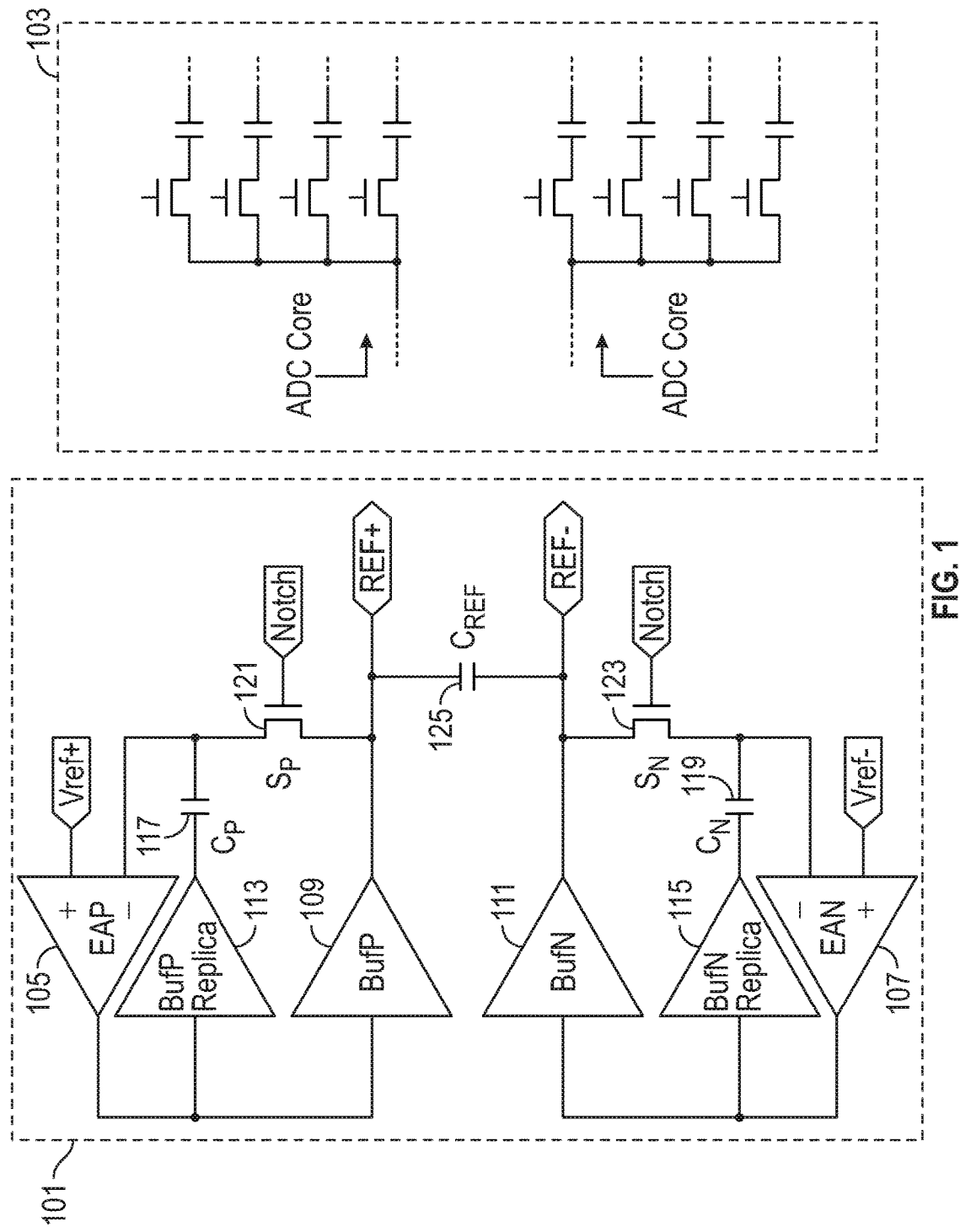
FIG. 1 illustrates an example of a precision buffer system that may generate a differential output that may be applied to a switched load, such as to an analog-to-digital converter.

FIG. 1 illustrates an example of a precision buffer system 101 that may generate a differential output that may be applied to a switched load, such as to a differential analog-to-digital converter (ADC) core 103. As illustrated in FIG. 1, the precision buffer system 101 may include error amplifiers 105 and 107, main buffers 109 and 111, replica buffers 113 and 115, offset sampling capacitances 117 and 119, electronic switches 121 and 123, and a load capacitance 125, connected as illustrated. As also illustrated in FIG. 1, the precision buffer system 101 may be used to drive a switched load, such as the differential ADC core 103. The precision buffer system 101 may or may not be on the same chip as the analog-to-digital converter 103.

As illustrated in FIG. 1, the top and bottom halves of the precision buffer system may be the same, with differences only in absolute voltages that are being buffered. The error amplifiers 105 and 107 may be chopped to increase precision and eliminate drift. Chopping may apply modulation to transpose the desired signal to a higher frequency, then demodulate it back to baseband and, in doing so, may remove offset and greatly reduces noise.

While at rest (no load condition), the electronic switches 121 and 123 may be driven "ON" by a switching signal, such as by a notch signal. This may incorporate the main buffers 109 and 111 in the feedback loop which drives the output voltages (Ref±) equal to input reference voltages (Vref±). Prior to a switched-load event, the electronic switches 121 and 123 may be turned "OFF" by the notch signal. This may remove the main buffers 109 and 111 from the feedback loop, isolating the error amplifiers 105 and 107 from disturbances at the REF± nodes.

During the time the electronic switches 121 and 123 are "OFF," the replica buffers 113 and 115 and the capacitors 117 and 119 may be used to create a "frozen" feedback loop from which the main buffers 109 and 111 are still driven. The main buffers 109 and 111 may be single-ended, high-speed buffers. Along with the capacitance 125, the main buffers 109 and 111 may provide a "per-cycle" switched-load current that may be required by the differential ADC core 103, After the switched-load (ADC conversion in this example) event is complete, the electronic switches 121 and 123 may then be turned "ON" by the switching signal.

Figure 2:
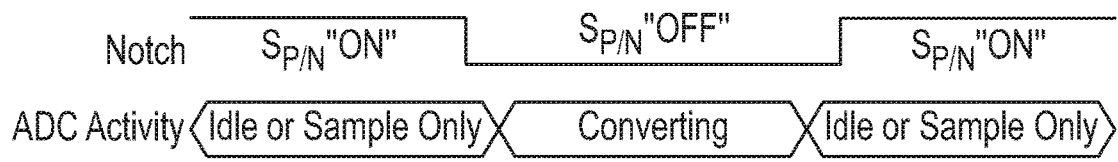
FIG. 2 illustrates an example of a switching signal (designated therein as a "notch" signal) that may be generated by a switched load, such as by an analog-to-digital converter, and corresponding activity of that switch load.

FIG. 2 illustrates an example of a switching signal (designated therein as a "notch" signal) that may be generated by a switched load, such as by an analog-to-digital converter, and corresponding activity of that switched load (designated therein as "ADC Activity"). As can be seen in FIG. 2, the notch signal may cause the electronic switches 121 and 123 to be on when the differential ADC core 103 is idle or sampling (and thus not switching), but off when the differential ADC core 103 is converting (and thus is switching). The notch signal may be generated by the ADC core 103 or by another circuit that is driving or monitoring the operation of the ADC core 103.

Figure 3:
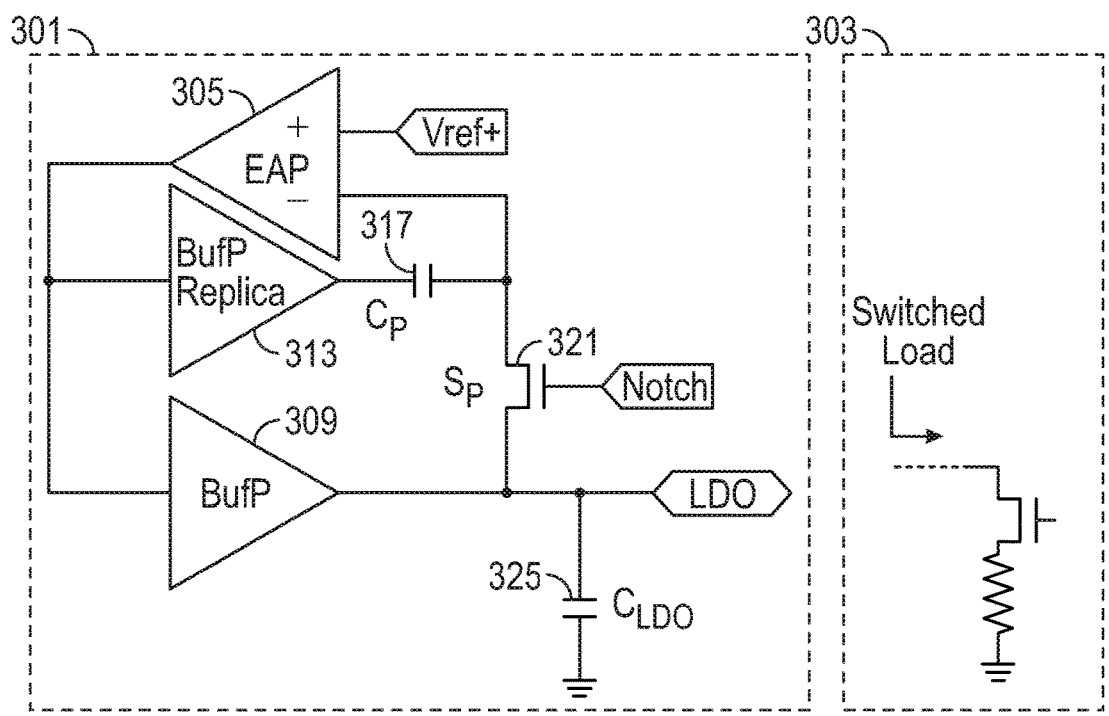
FIG. 3 illustrates an example of a precision buffer system that may generate a single-ended output that may be applied to a switched load, such as to a low drop out (LDO) linear regulator.

FIG. 3 illustrates an example of a precision buffer system 301 that may generate a single-ended output that may be applied to a switched load 303. As illustrated in FIG. 3, the precision buffer system 101 may include an error amplifier 305, a main buffer 309, a replica buffer 313, an offset sampling capacitance 317, an electronic switch 321, and a load capacitance 325, connected as illustrated. As also illustrated in FIG. 3, the precision buffer system 301 may be used to drive a switched load 303. The precision buffer system 301 may or may not be on the same chip as the switched load 303. The error amplifier 305 may be chopped to increase precision and eliminate drift. Chopping may apply modulation to transpose the desired signal to a higher frequency, then demodulate it back to the baseband and, in doing so, remove offset and greatly reduces noise.

The precision buffer system 301 may operate in the same way as the precision buffer system 101 illustrated in FIG. 1, except that it may only generate a single ended output. An example of this operation will now be described.

While at rest (no load/light load condition), the electronic switch 321 may be turned "ON" by the notch signal. This may incorporate the main buffer 309 in the feedback loop, which may drive the output voltage (LDO) equal to an input reference voltages (Vref+). Prior to a switched-load event, the electronic switch 321 may be turned "OFF" by the notch signal. This may remove the main buffer 309 from the feedback loop, isolating the error amplifier 305 from disturbances at the LDO node. During the time the electronic switch 321 is "OFF," the replica buffer 313 and the capacitance 317 may be used to create a "frozen" feedback loop from which the main buffer 309 is still driven.

The main buffer 309 may be single-ended and high-speed and provide, along with the output capacitance 325, the current required by the switched-load 303. After the switched-load event is complete, the electronic switch 321 may then be turned "ON" by the notch signal.

Figure 4:
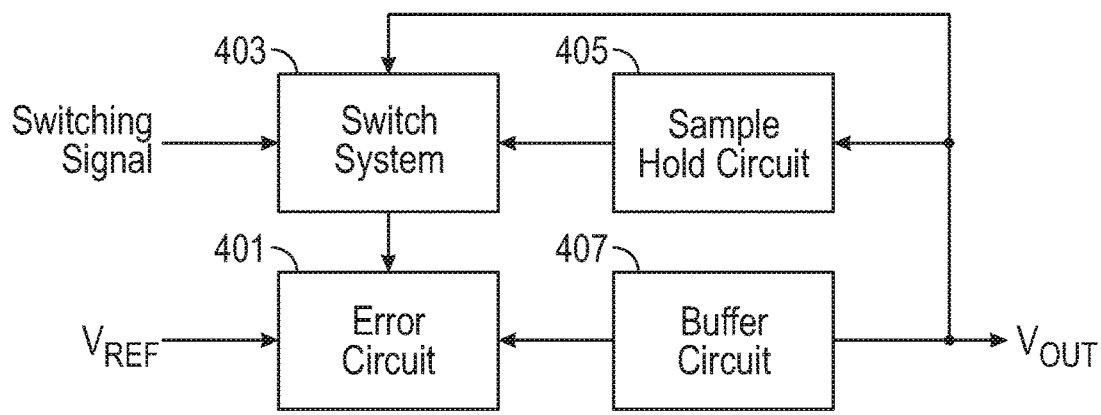
FIG. 4 is a block diagram of an example of a precision buffer system whose output may be applied to a switched load, such as to an analog-to-digital converter.

FIG. 4 is a block diagram of an example of a precision buffer system whose output may be applied to a switched load, such as to an analog-to-digital converter. As illustrated in FIG. 4, the precision buffer system may include an error circuit 401, a switching system 403, a sample/hold circuit 405, and a buffer circuit 407.

The error circuit 401 may determine an error in the output $V_{OUT}$, as compared to a reference voltage input $V_{REF}$. The error may be applied to the buffer circuit 407.

The buffer circuit 407 may generate a buffered output of the output of the error circuit 401. This buffered output may then be delivered to $V_{OUT}$.

The sample/hold circuit 405 may continuously sample and hold the output $V_{OUT}$ during such times as a switched load that is connected to $V_{OUT}$ is not actively switching, as reflected by the switching signal shown in FIG. 4. Once the switched load starts to actively switch, as also reflected by the switching signal, the sample/hold circuit 405 may stop updating its output, but instead hold its output at the value that existed immediately before the switched load began to actively switch, again as reflected by the switching signal.

The switch system 403 may deliver to the other input of the error circuit 401, either the output $V_{OUT}$, or the output of the sample/hold circuit 405, depending upon the status of the switching signal. If the switching signal indicates that the switched load is not actively switching, the switch system 403 may deliver the output $V_{OUT}$. Conversely, if the switching signal indicates that the switch load is actively switching, the switch system 403 may deliver the held value of $V_{OUT}$ immediately before the switched load began to actively switch, as held by the sample/hold. circuit 405.

The switching system 403 thus controls whether the circuit illustrated in FIG. 4 operates in an open or closed loop mode. When the switched load is not actively switching, the switching system 403 may cause the circuit to operate in a closed loop. When the switch load is actively switching, on the other hand, the switching system 403 may cause the circuit to operate in an open loop.

Figure 5:
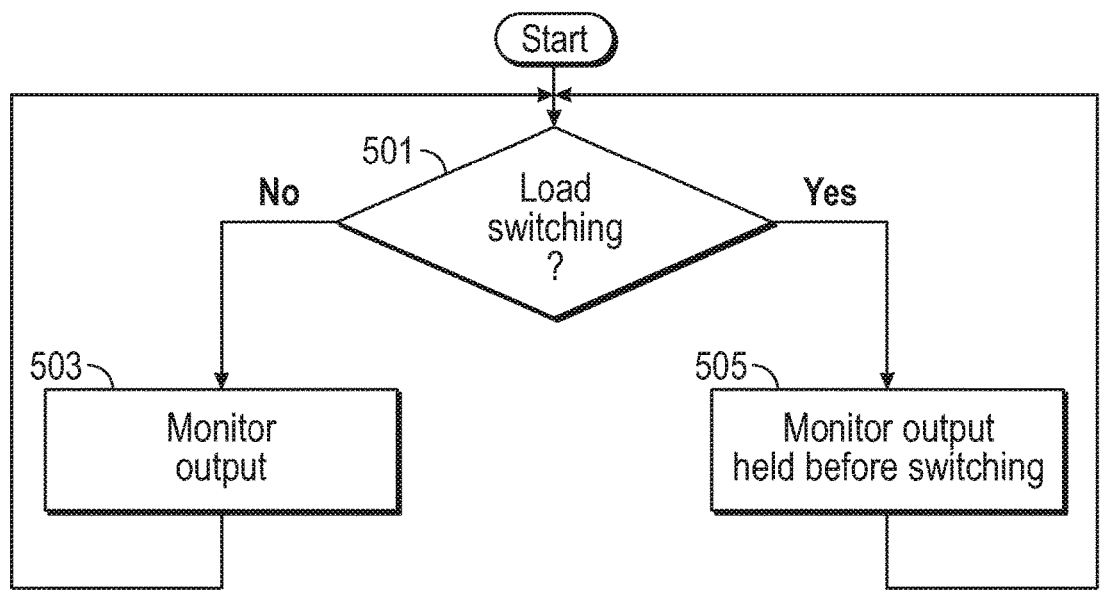
FIG. 5 is a flow diagram of an example of how the precision buffer system illustrated in FIG. 4 may operate.

FIG. 5 is a flow diagram of an example of how the precision buffer system illustrated in FIG. 4 may operate. As reflected by a Load Switching decision block 501, the precision buffer system may constantly monitor the switching signal to determine whether the switched load is actively switching. When the switched load is not actively switching, the output of the precision buffer is monitored in a closed loop, as reflected by a monitor output step 503. Conversely, while the switched load is actively switching, the output of the precision buffer may no longer be monitored, opting instead to use the output that existed immediately before the active switching took place, as reflected by a Monitor Output Held Before Switching step 505.

Figure 6:
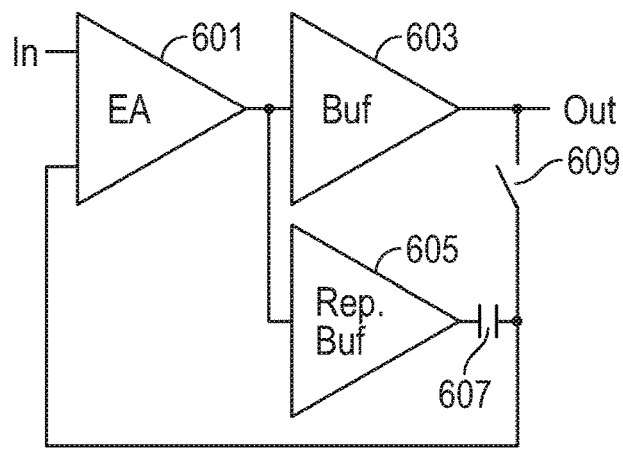
FIG. 6 is a simplified example of a precision buffer system whose output may be applied to a switched load.

FIG. 6 is a simplified example of a precision buffer system whose output may be applied to a switched load. As illustrated in FIG. 6, this precision buffer system may include an error amplifier 601, a main buffer 603, a replica buffer 605, an offset sampling capacitance 607, and an electronic switch 609. Each of these components may function as they did in connection with their corresponding component illustrated in FIG. 3 and described above.

Figure 7:
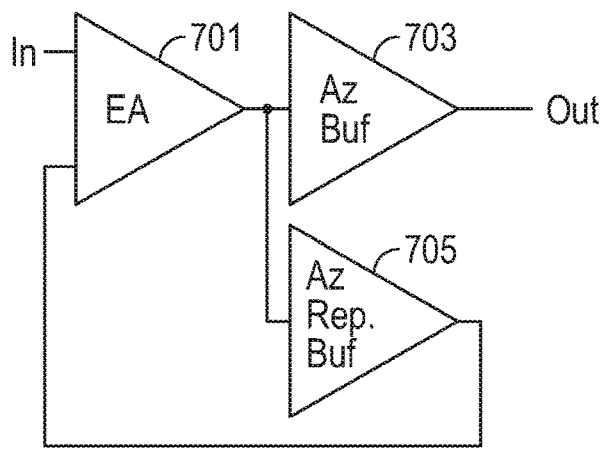
FIG. 7 is an example of the precision buffer system illustrated in FIG. 6 with auto zeroing of the main and replica buffers.

FIG. 7 is an example of the precision buffer system illustrated in FIG. 6 with auto zeroing of the main and replica buffers. As illustrated in FIG. 7, this precision buffer system may include an error amplifier 701, an auto-zeroing main buffer 703, and an auto-zeroing replica buffer 705. The error amplifier 701 may be and function the same as the error amplifier 305 illustrated in FIG. 3. The main buffer 309 and replica buffer 313 in FIG. 3 have been replaced by auto zeroing main buffer 703 and auto zeroing replica butler 705. The auto zeroing functions to sample the unwanted signals (noise and offset) and then subtract it from the instantaneous signal containing the same noise and offset creating a cancellation of the undesired noise and offset. Similar to the way that offset and temperature drift between the main buffer 309 and the replica buffer 313 in FIG. 3 is captured by the offset capacitor 317 and used to correct its output, the auto-zeroing buffers 703 and 705 of FIG. 7 may eliminate offset and temperature drift.

Figure 8:
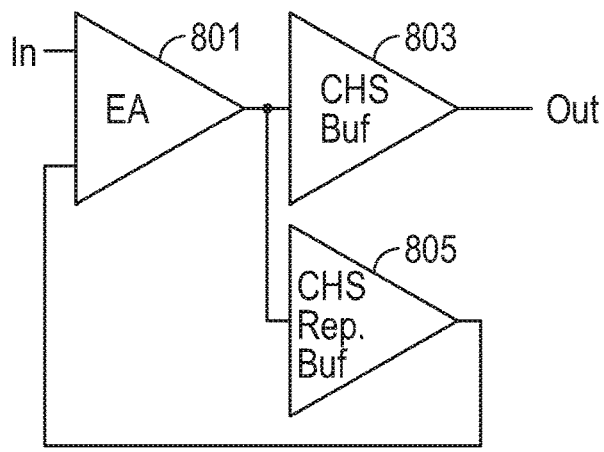
FIG. 8 is an example of the precision buffer system illustrated in FIG. 6 with chopper stabilization.

FIG. 8 is an example of the precision buffer system illustrated in FIG. 6 with chopper stabilization. As illustrated in FIG. 8, this precision buffer system may include an error amplifier 801, a chopper-stabilized main buffer 803, and a chopper-stabilized replica buffer 805. The error amplifier 801 may be and function the same as the error amplifier 305 illustrated in FIG. 3. The main buffer 309 and replica buffer 313 in FIG. 3 have been replaced by the chopper-stabilized main buffer 803 and the chopper-stabilized replica buffer 805. Chopper-stabilization may apply modulation to transpose the desired signal to a higher frequency, then demodulate it back to the baseband and, in doing so, remove offset and greatly reduce noise.

Figure 9:
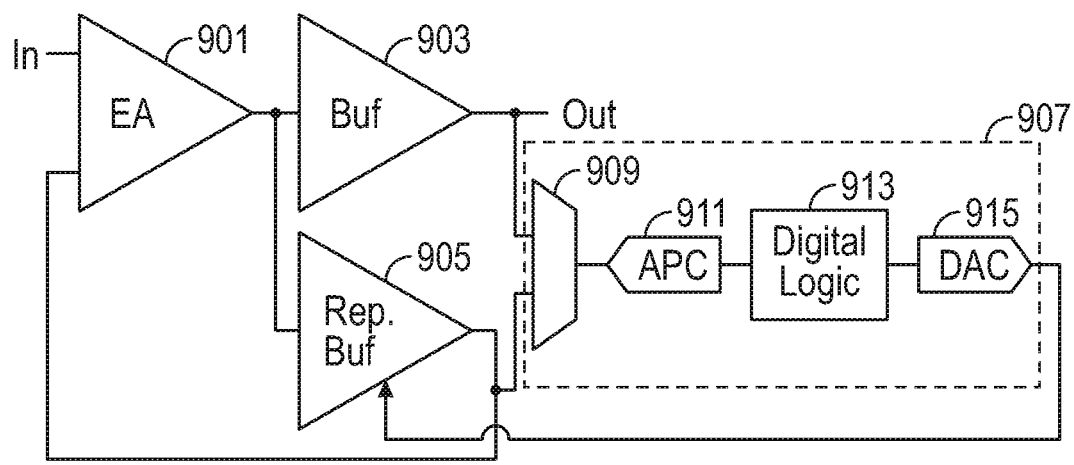
FIG. 9 is an example of the precision buffer system illustrated in FIG. 6 with digital calibration.

FIG. 9 is an example of the precision buffer system illustrated in FIG. 6 with digital calibration. As illustrated in FIG. 9, this precision buffer system may include an error amplifier 901, main buffer 903, replica buffer 905, and a calibration backend 907 which may include a multiplexer 909, an analog-to-digital converter 911, digital logic 913, and a digital to analog converter 915. The error amplifier 901, main buffer 903, and replica buffer 905 may be and function the same as the corresponding error amplifier 301, main buffer 303, and replica buffer 305 in FIG. 3. The calibration backend 907 may measure the difference between the output of the main buffer 903 and the replica butler 905 and adjust the offset of the replica buffer 905 to match that of the main buffer 903. If done periodically, this variation may also exhibit no offset or temperature drift.

Buffer systems have now been described that may have an output for driving a switched load that changes during periods indicated by a switching signal. The buffer systems may operate in a closed loop when the switching signal indicates that a load change is not taking place by comparing a signal indicative of the output of the buffer system with a reference voltage. The buffer systems may operate in an open loop when the switching signal indicates that a load change is taking place by not comparing signal indicative of the output of the buffer system with the reference voltage.

An error amplifier may generate an error signal output indicative of a difference between the reference voltage at a first input to the error amplifier and a monitored voltage at a second input to the error amplifier. A main buffer may buffer the error signal output from the error amplifier and deliver that buffered error signal output to the output of the buffer system. A replica buffer may buffer the error signal output from the error amplifier. A capacitance may be connected between the output of the replica buffer and the second input to the error amplifier.

A controllable electronic switch may connect the second input of the error amplifier to the output of the buffer system when the switching signal indicates that a load change is not taking place, and disconnect the second input of the error amplifier from the output of the buffer system when the switching signal indicates that a load change is taking place.

The output of the buffer system may be single ended or differential.

The main buffer and the replica buffer may be auto-zeroing buffers.

The main buffer and the replica buffer may include chopper stabilization.

The buffer system may include a backend calibration circuit.

Both the buffer system and the switched load may be on the same chip.

The precision buffer systems that have now been described may overcome the problem of choosing between high-speed and precision settling for on-chip buffers in switched-load circuit systems. This switched-load rejection may allow the high-gain feedback path, which controls precision, to have low bandwidth and thus save power. During the switch-load event, the low bandwidth feedback path may be isolated from any disturbance that could cause adverse settling behavior, while a high-speed replica buffer driven by the same feedback loop (but not part of the feedback loop) may provide the required current for the load. This approach may also make the design more reusable due to the fact that no additional pins or external components may be required.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by an "a" or an "an" does not, without further constraints, preclude the existence of additional elements of the identical type.

None of the claims are intended to embrace subject matter that fails to satisfy the requirement of Sections 101, 102 or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

What is claimed is:

1. A buffer system having an output for driving a switched load and an input for receiving a switching signal that represents a presence or an absence of the switched load, wherein the switching signal is generated by the switched load or another circuit driving or monitoring the switched load, the buffer system comprising:
   an error amplifier configured to generate an error signal output responsive to a difference between a reference voltage and a voltage at the output; and
   a main buffer configured to receive and buffer the error signal output from the error amplifier and deliver the buffered error signal output to the output of the buffer system,
      wherein, in a closed loop configuration, the output of the main buffer is switchably coupled to the error amplifier in response to the switching signal indicating the absence of a load change, and
      wherein, in an open loop configuration, the output of the main buffer is switchably decoupled from the error amplifier in response to the switching signal indicating the presence of the load change.

2. The buffer system of claim 1, further comprising:
   a replica buffer configured to receive and buffer the error signal output from the error amplifier.

3. The buffer system of claim 2, further comprising:
   a capacitance connected between an output of the replica buffer and an input to the error amplifier; and
   a controllable electronic switch configured to:
   connect the input of the error amplifier to the output of the buffer system when the switching signal indicates the absence of the load change; and
   disconnect the input of the error amplifier from the output of the buffer system when the switching signal indicates the presence of the load change.

4. The buffer system of claim 2 wherein the main buffer and the replica buffer are auto-zeroing buffers.

5. The buffer system of claim 2 wherein the main buffer and the replica buffer include chopper stabilization.

6. The buffer system of claim 2 further comprising a backend calibration circuit.

7. An electronic circuit on a single chip comprising:
   a switched load;
   a buffer system having an output for driving the switched load and an input for receiving a switching signal that represents a presence or an absence of the switched load, wherein the switching signal is generated by the switched load or another circuit driving or monitoring the switched load, the buffer system comprising:
   an error amplifier configured to generate an error signal output responsive to a difference between a reference voltage and a voltage at the output; and
   a main buffer configured to receive and buffer the error signal output from the error amplifier and deliver the buffered error signal output to the output of the buffer system,
      wherein, in a closed loop configuration, the output of the main buffer is switchably coupled to the error amplifier in response to the switching signal indicating the absence of a load change, and
      wherein, in an open loop configuration the output of the main buffer is switchably decoupled from the error amplifier in response to the switching signal indicating the presence of the load change.

8. The electronic circuit of claim 7, further comprising:
   a replica buffer configured to receive and buffer the error signal output from the error amplifier.

9. The electronic circuit of claim 8, further comprising:
   a capacitance connected between an output of the replica buffer and an, input to the error amplifier; and
   a controllable electronic switch configured to:
   connect the input of the error amplifier to the output of the buffer system when the switching signal indicates the absence of the load change; and
   disconnect the input of the error amplifier from the output of the buffer system when the switching signal indicates the presence of the load change.

10. The electronic circuit of claim 8 wherein the main buffer and the replica buffer are auto-zeroing buffers.

11. The electronic circuit of claim 8 wherein the main buffer and the replica buffer include chopper stabilization.

12. The electronic circuit of claim 8 further comprising a backend calibration circuit.

13. A buffer system having an output for driving a switched load and an input for receiving a switching signal that represents a presence or an absence of the switched load, wherein the switching signal is generated by the switched load or another circuit driving or monitoring the switched load, the buffer system comprising:
  means for generating an error signal output responsive to a difference between a reference voltage and a voltage at the output;
  first means for receiving and buffering the error signal output from the error amplifier and delivering the buffered error signal output to the output of the buffer system,
    wherein, in a closed loop configuration, the output of the first means for receiving and buffering is switchably coupled to the means for generating the error signal output in response to the switching signal indicating the absence of a load change, and
    wherein, in an open loop configuration, the output of first means for receiving and buffering is switchably decoupled from the means for generating the error signal output in response to the switching signal indicating the presence of the load change.

14. The buffer system of claim 13 further comprising:
  second means for receiving and buffering the error signal output from the means for generating the error signal, the second means for receiving and buffering different from the first means for receiving and buffering.

15. The buffer system of claim 14 wherein first means for receiving and buffering and the second means for receiving and buffering are auto-zeroing.

16. The buffer system of claim 14 wherein the first means for receiving and buffering and the second means for receiving and buffering include chopper stabilization.

17. The buffer system of claim 14 further comprising backend calibration means for measuring a difference between an output of the first means for receiving and buffering and the second means for receiving and buffering and for adjusting the second means for receiving and buffering to match the output of the first means for receiving and buffering.

* * * * *